United States Patent
Chen et al.

(10) Patent No.: US 8,921,131 B2
(45) Date of Patent: Dec. 30, 2014

(54) METHOD FOR MANUFACTURING LIGHT EMITTING DIODE PACKAGE

(71) Applicants: Lung-Hsin Chen, Hsinchu (TW); Wen-Liang Tseng, Hsinchu (TW)

(72) Inventors: Lung-Hsin Chen, Hsinchu (TW); Wen-Liang Tseng, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 231 days.

(21) Appl. No.: 13/653,634

(22) Filed: Oct. 17, 2012

(65) Prior Publication Data

US 2013/0244355 A1 Sep. 19, 2013

(30) Foreign Application Priority Data

Mar. 15, 2012 (CN) .......................... 2012 1 00684079

(51) Int. Cl.
*H01L 21/00* (2006.01)

(52) U.S. Cl.
USPC ............................................................. 438/27

(58) Field of Classification Search
USPC .................................................. 257/E33.056
See application file for complete search history.

(56) References Cited

U.S. PATENT DOCUMENTS

| | | | | |
|---|---|---|---|---|
| 2010/0140638 A1* | 6/2010 | Kotani et al. | .................... | 257/98 |
| 2010/0181582 A1* | 7/2010 | Li et al. | ............................ | 257/91 |
| 2011/0045619 A1* | 2/2011 | Ling | ................................ | 438/29 |
| 2011/0068358 A1* | 3/2011 | Kuo et al. | ........................ | 257/98 |
| 2011/0210367 A1* | 9/2011 | Kim | ................................. | 257/98 |
| 2012/0052608 A1* | 3/2012 | Yoo et al. | ......................... | 438/27 |
| 2012/0097986 A1* | 4/2012 | Ku et al. | .......................... | 257/88 |
| 2014/0106480 A1* | 4/2014 | Yoo et al. | ......................... | 438/15 |
| 2014/0141283 A1* | 5/2014 | Lee et al. | ....................... | 428/690 |

FOREIGN PATENT DOCUMENTS

| | | | |
|---|---|---|---|
| TW | 200717853 A | 5/2007 | |
| TW | 200717856 A | 5/2007 | |
| TW | 200723566 A | 6/2007 | |
| TW | 201037865 A | 10/2010 | |

* cited by examiner

*Primary Examiner* — Asok K Sarkar
(74) *Attorney, Agent, or Firm* — Novak Druce Connolly Bove + Quigg LLP

(57) ABSTRACT

An exemplary method for manufacturing an LED package includes following steps: providing a substrate; forming a reflector on the substrate with a receiving chamber defined in the reflector; providing an LED chip and mounting the LED chip on the substrate wherein the LED chip is received in the receiving chamber; providing a gelatinous phosphor layer and arranging the gelatinous phosphor layer on a top end of the reflector wherein the gelatinous phosphor layer covers the receiving chamber and phosphor powder is evenly distributed in the gelatinous phosphor layer; providing a pressing mold and arranging the pressing mold on a top end of the gelatinous phosphor layer; pressing the pressing mold toward the gelatinous phosphor layer to make the gelatinous phosphor layer fill in the receiving chamber; solidifying the gelatinous phosphor layer.

20 Claims, 8 Drawing Sheets

METHOD FOR MANUFACTURING LIGHT EMITTING DIODE PACKAGE

BACKGROUND

1. Technical Field

The disclosure generally relates to semiconductor devices and, more particularly to a method for manufacturing light emitting diode (LED) package.

2. Description of Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

A conventional LED package includes a substrate, an LED chip mounted on the substrate and a phosphor layer covering the LED chip. During operation, light emitted from the LED chip stimulates the phosphor powder in the phosphor layer to generate light with a different color; the light from the LED chip and the light from the phosphor powder combine together to obtain an illuminating light having a desired color. In the manufacturing process, transparent glue mixes with phosphor powder to form the phosphor layer and the phosphor layer is arranged on the substrate to cover the LED chip. However, the phosphor powder is prone to move downward and accumulate at a bottom of the phosphor layer. Thus, the illuminating light from the LED package can not have a uniform color and the required CRI (color rendering index).

What is needed, therefore, is an improved LED package which can overcome the above described shortcomings.

DETAILED DESCRIPTION

Embodiments of LED packages will now be described in detail below and with reference to the drawings.

Referring to FIGS. 1-9, a method for manufacturing an LED package in accordance with an exemplary embodiment of the disclosure includes the following steps.

Figure 1:
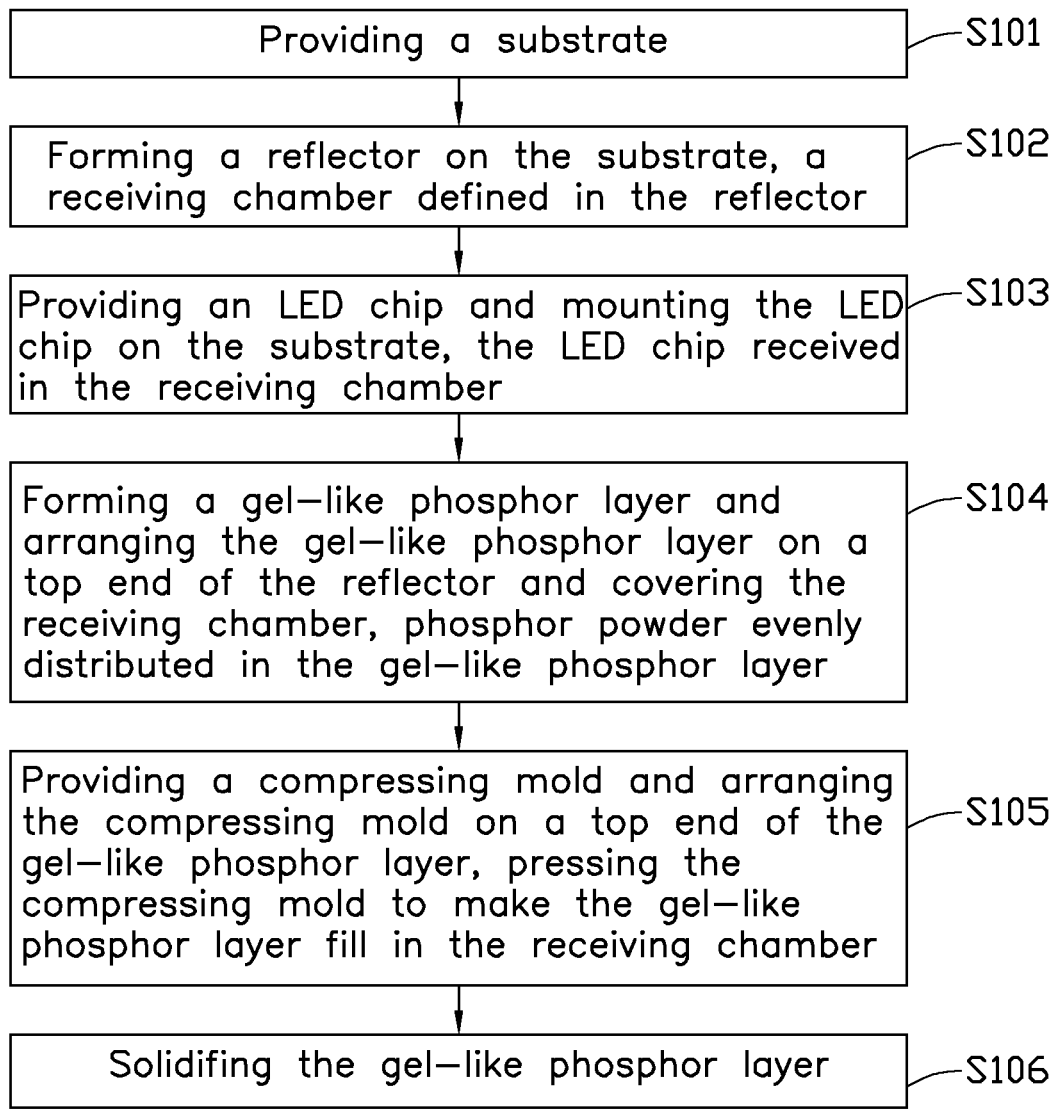
FIG. 1 is a flowchart of a method for manufacturing an LED package according to an embodiment of the present disclosure.
Figure 2:
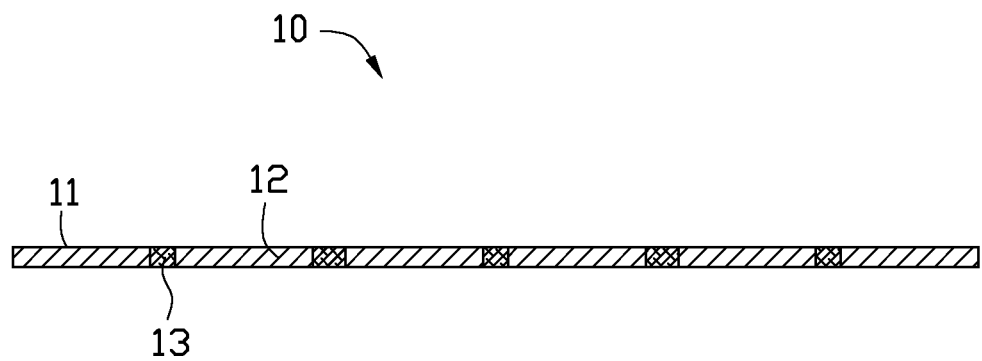
FIGS. 2-8 are schematic, cross-sectional views showing steps of the method for manufacturing the LED package of FIG. 1.

Referring to FIGS. 1 and 2, at step S101 a substrate 10 is provided. The substrate 10 is an elongated aluminum plate, ceramic plate, aluminum oxide plate, zinc oxide plate, or silicon plate. A plurality of first electrodes 11 and a plurality of second electrodes 12 are embedded in the substrate 10. The substrate 10 includes a plurality of electrical insulating portions 13. The first electrodes 11 and the second electrodes 12 are alternate, and electrically insulated from each other by the electrical insulating portions 13. Top and bottom surfaces of the first and second electrodes 11, 12 are coplanar to top and bottom surfaces of the substrate 10, respectively. Two adjacent first electrode 11 and second electrode 12 and the electrical insulating portion 13 between the adjacent first electrode 11 and second electrode 12 cooperatively form a unit 24.

Figure 3:
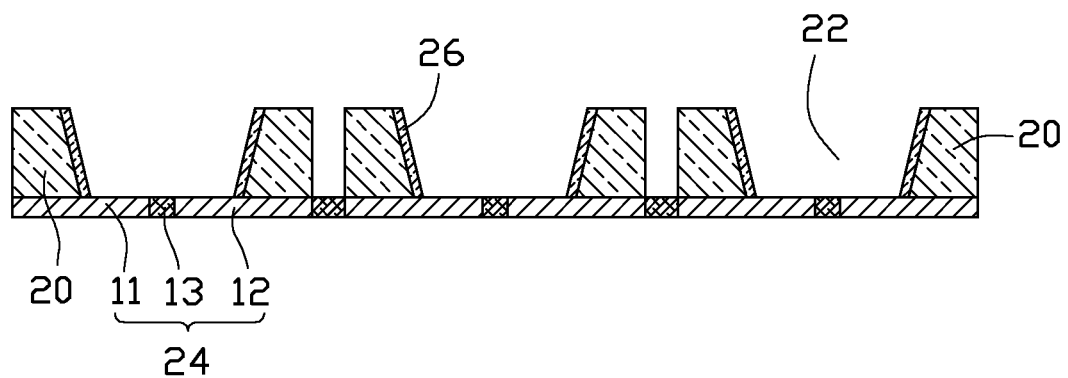

Referring to FIG. 3, at step S102 a plurality of reflectors 20 is formed on the substrate 10 by injection molding or transfer molding. Each reflector 20 is opaque, made of polyphthalamide, and formed on a corresponding unit 24. A bottom end of the reflector 20 is formed on a top surface of the unit 24. Each reflector 20 is a hollow cylinder and a receiving chamber 22 is defined in a center thereof from top to bottom. A bore diameter of the receiving chamber 22 gradually decreases from top to bottom. The receiving chamber 22 is used to receive an LED chip 30 (shown in FIG. 4) therein. An inner surface of the receiving chamber 22 reflects light emitted from the LED chip 30. An outer periphery of each reflector 20 is aligned with an outer edge of the corresponding unit 24. The electrical insulating portion 13 of the unit 24 is located at a center of the bottom end of the reflector 20. Preferably, a reflecting film 26 is coated on the inner surface of the receiving chamber 22 to enhance a light reflecting efficiency of the reflector 20.

Figure 4:
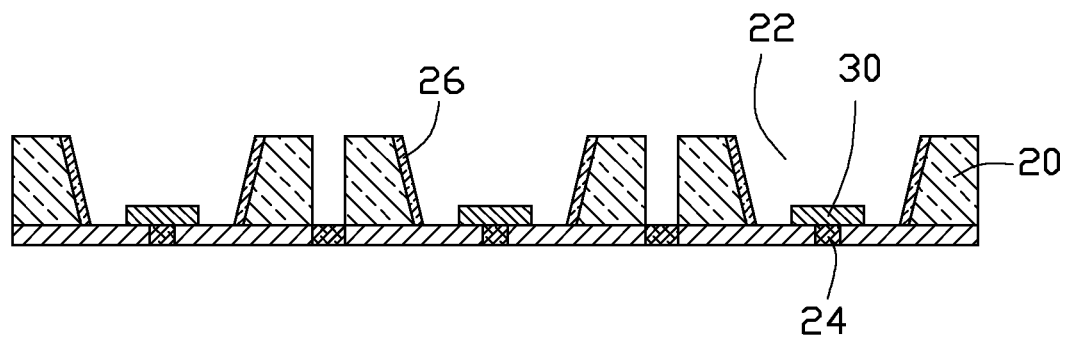

Referring to FIG. 4, at step S103 the LED chips 30 are provided and mounted on the substrate 10, located corresponding to the units 24, respectively. Each LED chip 30 is received in a corresponding receiving chamber 22 of the reflector 20; a center of each LED chip 30 is mounted on the top surface of the electrical insulating portion 13 and opposite ends thereof are mounted on top surfaces of the first electrode 11 and the second electrode 12 to electrically connect with the first electrode 11 and the second electrode 12, respectively.

Figure 5:
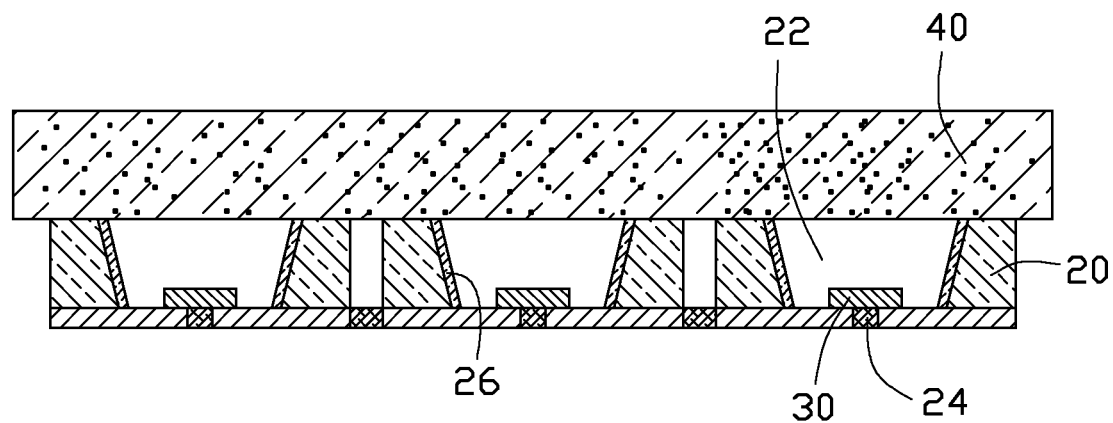

Referring to FIG. 5, at step S104 a gelatinous phosphor layer 40 is provided and arranged on top ends of the reflectors 20 to make the phosphor layer 40 cover the receiving chambers 22. When the gelatinous phosphor layer 40 is manufactured, transparent powder and phosphor powder are provided and mixed together to obtain a mixture. A percentage of a quantity of the phosphor powder to a quantity of the transparent powder is in a range about from 5% to 50%. A material of the transparent powder is selected from silicone, epoxy, or silicone acrylate resin. A material of the phosphor powder is selected from yttrium aluminum garnet (YAG), terbium doped YGA and so on. The mixture is received in a mold and centrifugalized by a centrifuge to make the transparent powder and the phosphor powder mixed evenly. The mold is heated under 80 degrees centigrade to 150 degrees centigrade for 15 minutes until the mixture is gelled. Thus, the gelatinous phosphor layer 40 is formed. A durometer shore hardness scale of the phosphor layer 40 is between 30 A and 60 A. An area of the gelatinous phosphor layer 40 is equal to that of the substrate 10. The gelatinous phosphor layer 40 is arranged on the top ends of the reflectors 20 and covers the receiving chambers 22 of the reflectors 20. A thickness of the gelatinous phosphor layer 40 is larger than a thickness of the substrate 10.

Figure 6:
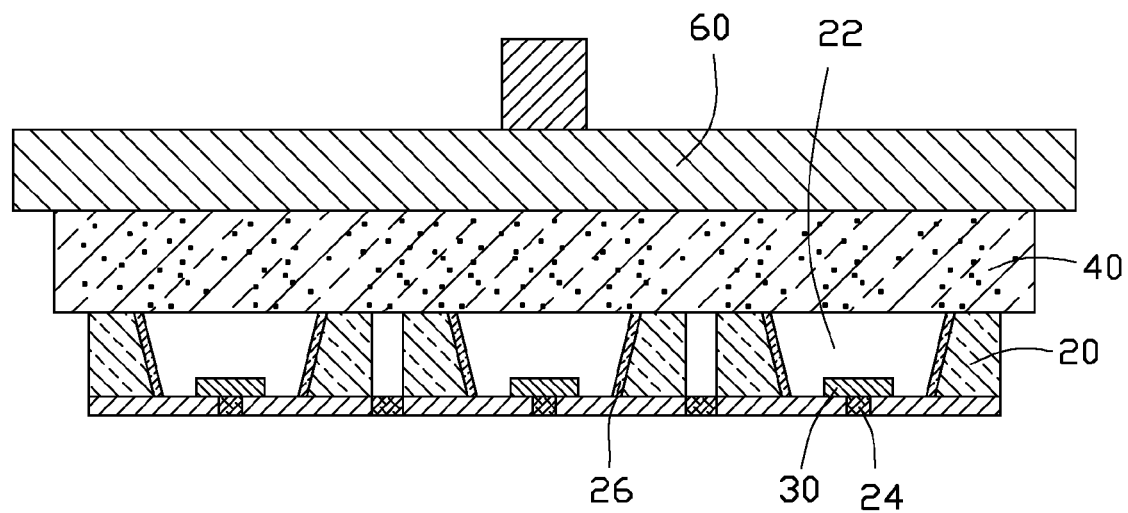

Referring to FIG. 6, at step S105 a pressing mold 60 is provided and arranged on a top of the gelatinous phosphor layer 40. The pressing the pressing mold 60 is used for pressing the gelatinous phosphor layer 40 into the receiving chambers 22. The pressing mold 60 is elongated and a size thereof is larger than that of the gelatinous phosphor layer 40. A bottom surface of the pressing mold 60 contacts a top face of the phosphor layer 40. The units 24 are completely covered by the gelatinous phosphor layer 40. The top ends of the reflectors 20 are in engagement with the gelatinous phosphor layer 40.

Figure 7:
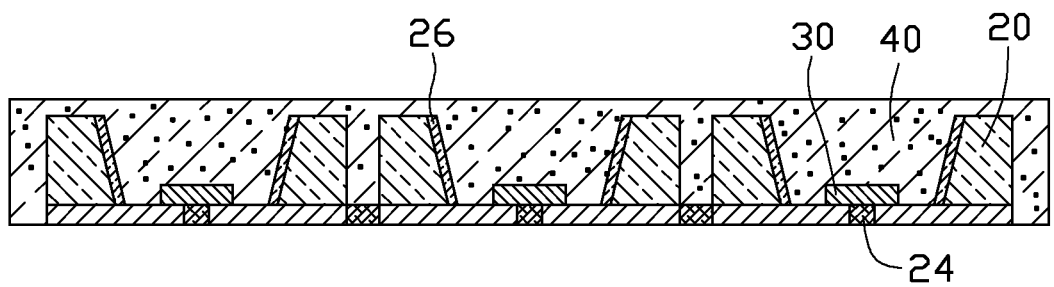
Figure 8:
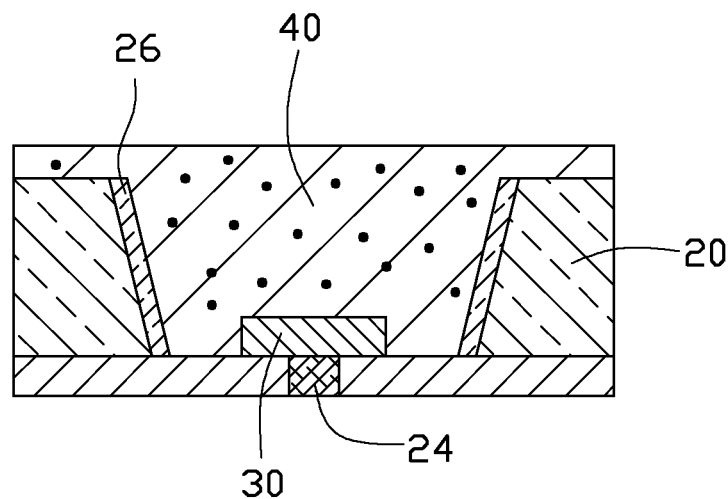

Referring to FIG. 7, then, the pressing mold 60 moves downwardly to press the gelatinous phosphor layer 40 into the chambers 22 whereby the gelatinous phosphor layer 40 fills in the receiving chamber 22 of each reflector 20. A top end of the gelatinous phosphor layer 40 is above the top ends of the reflectors 20, and a bottom surface of the substrate 10 is coplanar a bottom surface of the gelatinous phosphor layer 40.

At step S106 the gelatinous phosphor layer 40 is heated under 150 degrees centigrade whereby the gelatinous phosphor layer 40 is solidified.

At step S107 the units 24 are separated from each other to obtain a plurality of LED packages each having one LED chip 30.

In this disclosure, the transparent powder and the phosphor powder are evenly mixed to form the gelatinous phosphor layer 40 which is engaged with the units 24 in a gelatinous status. Therefore, a position of the phosphor powder in the gelatinous phosphor layer 40 is determined and not easily changed before the gelatinous phosphor layer 40 is solidified. Thus, the phosphor powder in the solidified phosphor layer 40 is evenly distributed whereby the light from the LED package can obtain an even color distribution and the desired color rendering index. In addition, the solidified phosphor layer 40 is filled in the receiving chamber 22 and covers the top end of the reflector 20; therefore, water or moisture can not easily permeate into the receiving chamber 22 via an interface between the solidified phosphor layer 40 and the top end of the reflector 20 to damage the LED chip 30. Thus, a reliability of the LED package is improved. Furthermore, because the durometer shore hardness scale of the gelatinous phosphor layer 40 is between 30 A and 60 A before solidified, when the gelatinous phosphor layer 40 is pressed in the receiving chamber 22, the soft gelatinous phosphor layer 40 will not damage the LED chip 30. Moreover, the gelatinous phosphor layer 40 is pressed in the receiving chamber 22 by the pressing mold 60, so the LED chip 30 is packaged easily.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing an LED package comprising following steps:
   providing a substrate;
   forming a reflector on the substrate, wherein the reflector defines a receiving chamber therein;
   providing an LED chip and mounting the LED chip on the substrate, the LED chip received in the receiving chamber;
   providing a gelatinous phosphor layer with phosphor powder evenly distributed therein, and arranging the gelatinous phosphor layer on a top end of the reflector and covering the receiving chamber;
   providing a pressing mold and arranging the pressing mold on a top end of the gelatinous phosphor layer, pressing the pressing mold toward the gelatinous phosphor layer to make the gelatinous phosphor layer fill in the receiving chamber; and
   solidifying the gelatinous phosphor layer.

2. The method of claim 1, wherein the gelatinous phosphor layer is a mixture of transparent powder and phosphor powder.

3. The method of claim 2, wherein a percentage of a quantity of the phosphor powder to a quantity of the transparent powder is a range from 5% to 50%.

4. The method of claim 2, wherein before gelled, the mixture is centrifugalized to make the transparent powder and the phosphor powder mixed evenly.

5. The method of claim 4, wherein after centrifugalized, the mixture is heated under 80 degrees centigrade to 150 degrees centigrade for 15 minutes until the mixture is gelled.

6. The method of claim 1, wherein a durometer shore harness scale of the gelatinous phosphor layer before solidified is between 30 A and 60 A.

7. The method of claim 1, wherein a thickness of the gelatinous phosphor layer is larger than a depth of the receiving chamber, and when the gelatinous phosphor layer is filled in the receiving chamber, a top end of the gelatinous phosphor layer is above the reflector and covers a top end of the reflector.

8. The method of claim 1, wherein the gelatinous phosphor layer is solidified by heating.

9. The method of claim 8, wherein a heating temperature of heating the gelatinous phosphor layer to solidify the gelatinous phosphor layer is 150 degrees centigrade.

10. The method of claim 1, wherein a reflecting film is coated on an inner surface of the receiving chamber to enhance a reflecting efficiency of the reflector.

11. The method of claim 1, wherein the substrate is an aluminum plate, ceramic plate, aluminum oxide plate, zinc oxide plate, or silicon plate.

12. The method of claim 1, wherein a first electrode and a second electrode are embedded in the substrate, and the substrate comprises an electronic insulating portion located between the first electrode and the second electrode to electronically insulate the first electrode from the second electrode.

13. The method of claim 1, wherein a bore diameter of the receiving chamber is generally decreases from top to bottom.

14. The method of claim 1, wherein the reflector is opaque.

15. A method for manufacturing an LED package comprising following steps:
    providing a unit formed by a first electrode, a second electrode and an electrical insulating portion electrically insulating the first electrode from the second electrode;
    forming a reflector on the unit, a receiving chamber being defined in the reflector;
    mounting an LED chip on the unit, the LED chip being received in the receiving chamber and electrically connecting with the first electrode and the second electrode;
    forming a gelatinous phosphor layer and arranging the gelatinous phosphor layer on a top end of the reflector and covering the receiving chamber, phosphor powder being evenly distributed in the gelatinous phosphor layer;
    providing a pressing mold and arranging the pressing mold on a top end of the gelatinous phosphor layer;
    pressing the pressing mold toward the gelatinous phosphor layer to make the gelatinous phosphor layer fill in the receiving chamber;
    solidifying the gelatinous phosphor layer.

16. The method of claim 15, wherein the gelatinous phosphor layer is a mixture of transparent powder and phosphor powder.

17. The method of claim 16, wherein before gelled, the mixture is centrifuged to make the transparent powder and the phosphor powder mixed evenly.

18. The method of claim 17, wherein after the mixture is centrifuged, the mixture is heated under 80 degrees centigrade to 150 degrees centigrade for 15 minutes until the mixture is gelled.

19. The method of claim 15, wherein a thickness of the gelatinous phosphor layer is larger than a depth of the receiving chamber, and when the gelatinous phosphor layer fills in the receiving chamber, a top end of the gelatinous phosphor layer is above the reflector and covers a top end of the reflector.

20. The method of claim 15, wherein the gelatinous phosphor layer is solidified by heating.

\* \* \* \* \*